United States Patent [19]
Sengupta

[11] Patent Number: 6,111,247
[45] Date of Patent: *Aug. 29, 2000

[54] PASSIVATION PROTECTION OF SENSOR DEVICES HAVING A COLOR FILTER ON NON-SENSOR PORTION

[75] Inventor: Kabul Sengupta, Tempe, Ariz.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/986,501

[22] Filed: Dec. 8, 1997

[51] Int. Cl.$^7$ ................................................. H01L 27/00
[52] U.S. Cl. ..................... 250/226; 250/208.1; 257/440
[58] Field of Search .................... 250/239, 214.1, 250/208.1, 216, 226; 257/431–436, 440

[56] References Cited

U.S. PATENT DOCUMENTS

| | | | |
|---|---|---|---|
| 4,315,978 | 2/1982 | Hartman | 257/432 |
| 4,600,833 | 7/1986 | Shibata et al. | 250/216 |
| 5,321,250 | 6/1994 | Tajima | 250/208.1 |

*Primary Examiner*—Que T. Le
*Attorney, Agent, or Firm*—Blakely, Sokoloff, Taylor & Zafman LLP

[57] ABSTRACT

A sensor device, an imaging system, and a method of forming a sensor device. The sensor device includes an integrated circuit having a sensor portion and non-sensor portion disposed about the periphery of the sensor portion, a passivation layer overlying a portion of a top surface of the non-sensor portion of the integrated circuit, and a protection layer overlying the passivation layer.

14 Claims, 6 Drawing Sheets

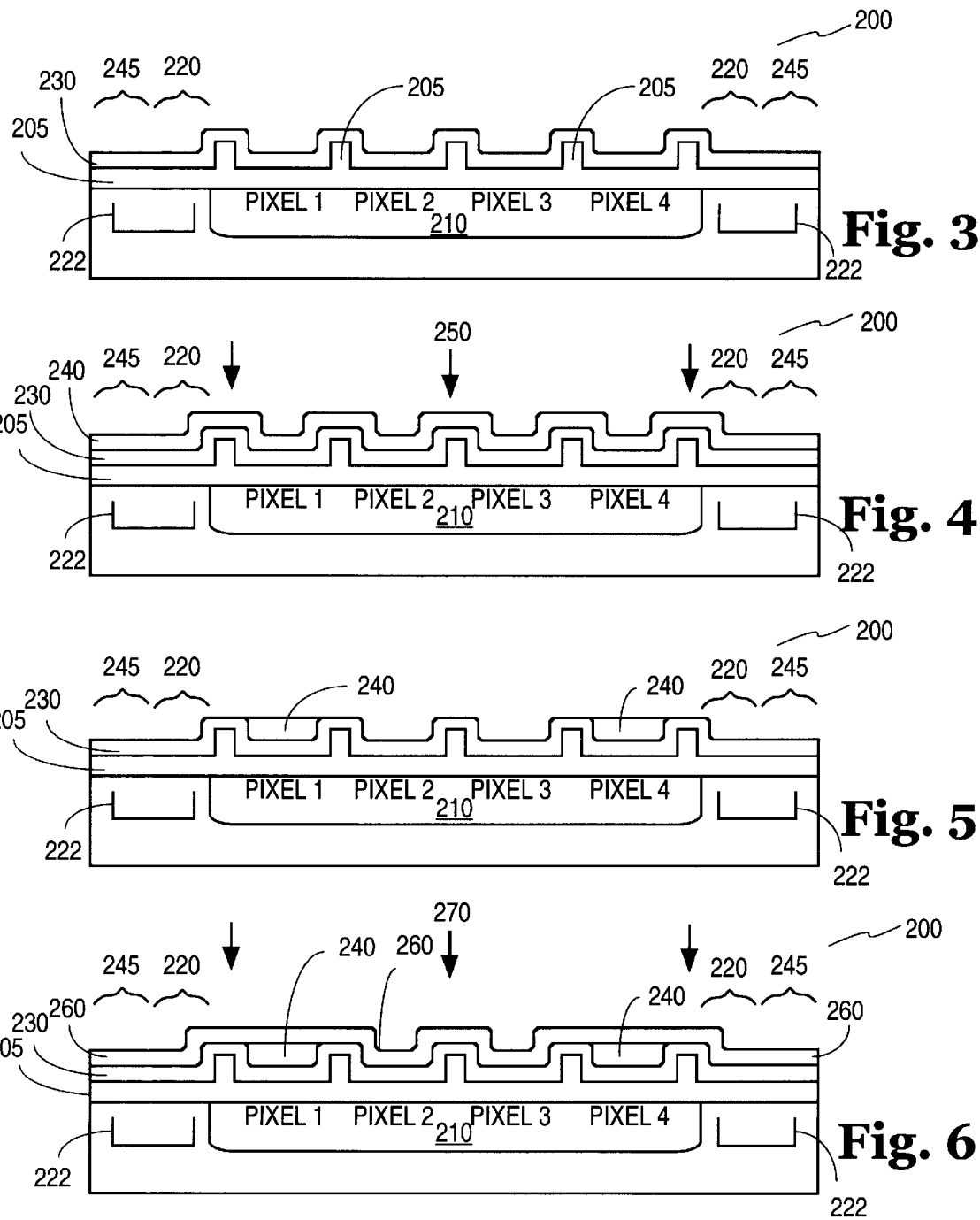

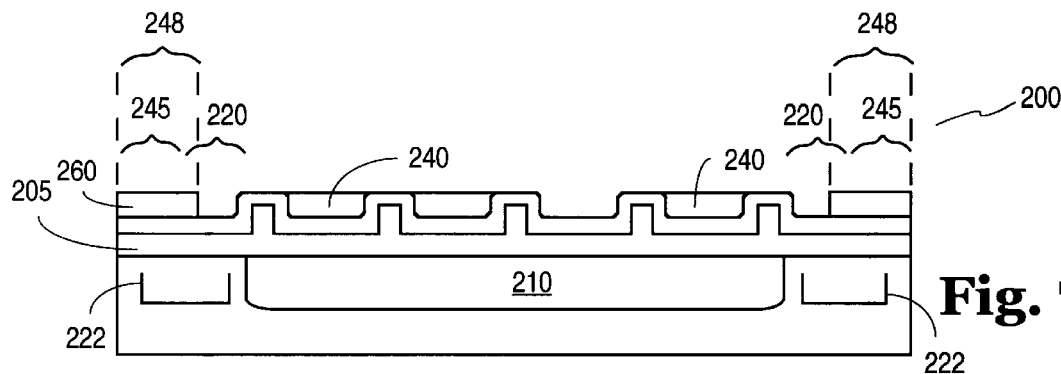
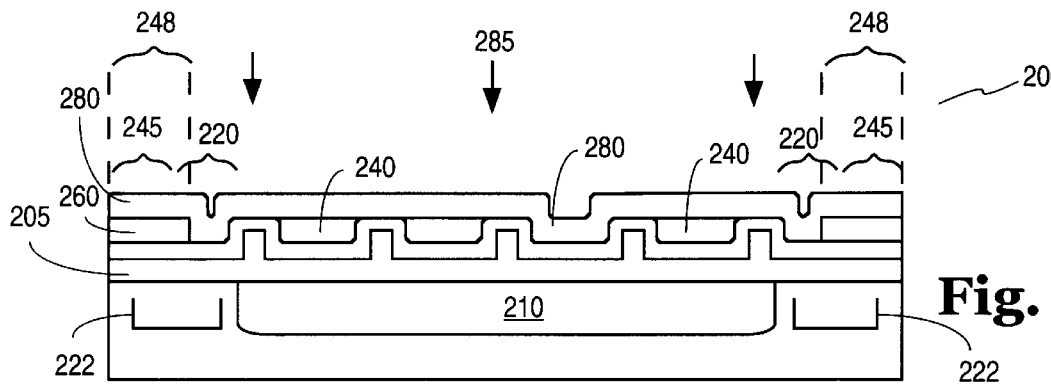
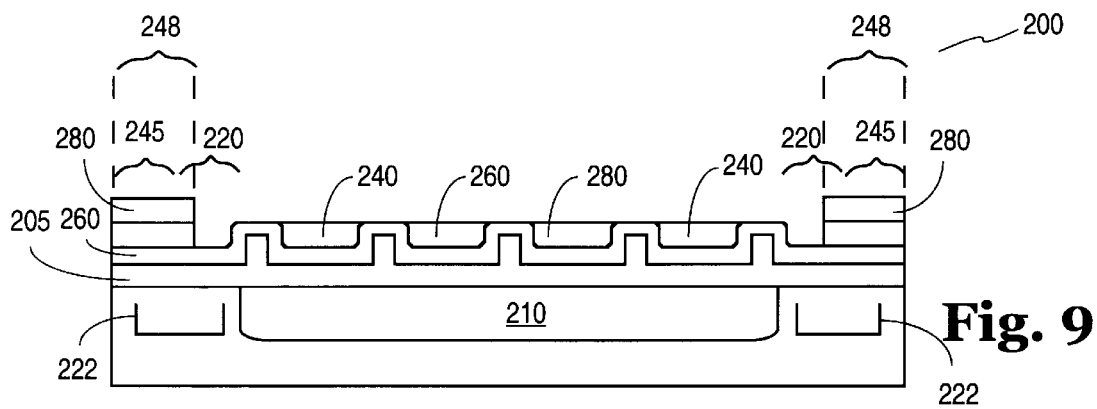

PASSIVATION PROTECTION OF SENSOR DEVICES HAVING A COLOR FILTER ON NON-SENSOR PORTION

BACKGROUND OF THE INVENTION

1. Field of the Invention

The invention relates to imaging systems and more particularly to protecting image capturing devices.

2. Description of Related Art

In general, an integrated circuit device or chip is made up of thousands to millions of individual devices coupled together in an integrated way through conductive metal lines. The interconnection of individual devices requires multiple layers of metal lines that are insulated from one another by dielectric material, such as for example silicon dioxide ($SiO_2$) or silicon nitride ($Si_3N_4$). Located on the periphery of the integrated circuit chip are bond pads. To activate the circuitry within the chip, it is necessary to supply voltage and input signals to the bond pads. These voltage signals are supplied to the bond pads through a package to which the integrated circuit device is affixed. Once affixed to a package, individual bond wires are used to electrically couple each bond pad of a chip to a corresponding pad on a package substrate. Each corresponding pad on a package substrate is then individually coupled to an external pin. The packaged integrated circuit device may then be placed within a socket in order to electrically couple the external pins to drivers that supply the necessary voltage and input signals to activate the integrated circuit chip. The bond pads also provide signals from the chip to other components of the system in which the chip is operating.

Digital imaging systems, such as for example digital cameras, utilize integrated circuit devices or chips as image capturing devices. An image capturing device, such as a camera, uses light to capture an image by a semiconductor-based chip. The chip replaces film in traditional film-based systems. In a camera, an image capturing device is configured, in its simplest form, to capture a monochrome or color image by way of field effect transistors (FETs), such as complementary metal oxide semiconductor (CMOS) devices or charge couple devices (CCDs).

In one example, the image capturing device is a chip made of a number of photodiodes, each photodiode capable of absorbing light. In color applications, each photodiode generally absorbs light through a color filter and represents one color corresponding to the image sensed. FIG. 1 illustrates an image capturing device or chip 100. FIG. 2 shows a schematic, planar side view of chip 100. Image capturing device 100 is fabricated as part of a die or wafer 10 with a plurality of other devices. Once formed, individual image capturing devices are separated from one another typically by a sawing process.

Image capturing device 100 contains a plurality of pixels, such as for example 480 rows by 640 columns. In general, each pixel contains a photosensing structure, such as a photodiode, and other pixel circuitry. The photosensing structure is the region of the pixel that responds to light while the pixel circuitry drives the light signal from the photosensing structure to other process circuitry. In FIGS. 1 and 2, the light capturing components are represented by sensor area 110.

In addition to sensor area 110, image capturing device 100 contains additional logic circuitry 120 that operates the individual pixels and drives signals from the pixels off device 100. In FIGS. 1 and 2, the device circuitry occupies an area of device 100 represented by logic area 120. It is to be appreciated that the device circuitry is not limited to logic area 120. Logic area 120 represents an area around the periphery of device circuitry as opposed to photogenerating structures, like photodiodes. To power device 100 and to drive signals off device 100, device 100 contains bond pads 125. Bond pads 125 are generally arranged on the periphery or top surface of device 100 and surround sensor area 110 and logic area 120. Bond pads 125 are typically located on the extreme periphery of device 100 in bond pad area 140. Bond pads 125 are electrically linked or coupled to device circuitry 122. Logic area 120 and bond pad area 140 collectively define a non-sensor area separate from sensor area 110.

The top surface of image capturing device 100 includes passivation layer 130. Passivation layer 130 is typically silicon nitride ($Si_3N_4$) or silicon oxynitride ($Si_xO_yN_z$) because of these materials resistance to environmental contaminants, particularly moisture. $Si_3N_4$ or $Si_xO_yN_z$ passivation layers 130 in suitable thicknesses to serve as a passivation layer, such as for example approximately 8000 angstroms (Å), are also transparent and therefore may overlay sensor area 110 without negative effects on the image capturing capabilities of sensor area 110. One problem associated with $Si_3N_4$ or $Si_xO_yN_z$ passivation layers 130 is that the layer is hard and brittle and subject to cracking. The microprocessor and other device applications may maintain their high integrity and use a passivation layer of $Si_3N_4$ or $Si_xO_yN_z$, because these microprocessor structures are typically overlaid with a photodefineable polyimide. The polyimide, among other things, protects the $Si_3N_4$ or $Si_xO_yN_z$ passivation layer during high volume assembly processes, most importantly the device pick-and-place process where an individual microprocessor device is selected, for example, by a collet and transferred into a package.

The polyimide used in microprocessor applications is not transparent and therefore will negatively effect imaging capturing devices. Thus, any polyimide that is used to protect a $Si_3N_4$ or $Si_xO_yN_z$ passivation layer of an image capturing device during handling must be removed, generally by exposing the image capturing device to a wet etch such as for example with a chemical solvent, before packaging.

SUMMARY OF THE INVENTION

A sensor device is disclosed. In one embodiment, the sensor device includes an integrated circuit having a sensor portion and a non-sensor portion disposed about the periphery of the sensor portion, a passivation layer overlying a portion of a top surface of the non-sensor portion of the integrated circuit, and a protection layer overlying the passivation layer. In further aspects of the invention, an imaging system and a method of forming a sensor device are disclosed.

Additional features and benefits of the invention will become apparent from the detailed description, figures, and claims set forth below.

BRIEF DESCRIPTION OF THE DRAWINGS

FIG. 3 is a schematic, planar side view of an image capturing device or chip having a sensor area, a logic area, and a scratch protection area and having a top surface including a passivation layer in accordance with an embodiment of the invention.

FIG. 4 is a planar side view of the device of FIG. 3 showing a first color filter material deposited over the top surface of the chip and subjected to a patterning etch in accordance with an embodiment of the invention.

FIG. 5 is a planar side view of the device of FIG. 3 showing a patterned first color material overlying the sensor area in accordance with an embodiment of the invention.

FIG. 6 is a planar side view of the device of FIG. 3 showing the further processing step of depositing a second color material over the top surface of the device and patterning the second color material with an etch in accordance with an embodiment of the invention.

FIG. 7 is a planar side view of the device of FIG. 3, a second color material patterned over a scratch protection area and the sensor area of the device or chip in accordance with an embodiment of the invention.

FIG. 8 is a planar side view of the device of FIG. 3 showing the further processing step of depositing a third color material over the device or chip and patterning the third color material with an etch in accordance with an embodiment of the invention.

FIG. 9 is a planar side view of the device of FIG. 3 showing a third color material patterned over the sensor area and the scratch protection area of the device or chip in accordance with an embodiment of the invention.

DETAILED DESCRIPTION OF THE INVENTION

The invention relates to an image capturing device, an image capturing system, and a method of forming an image capturing device and an image capturing system. In one aspect of the invention, the invention provides adequate protection of the passivation layer of an image capturing device during handling using color filter material as a protective barrier. In this manner, the passivation layer may be protected during pick and place handling steps with no impact to costs, throughput time, and processing.

In the following detailed description, specific details are described or referenced with respect to specific image capturing device configurations in order to completely describe the invention. It is to be appreciated that the specific details described or referenced need not be specifically adhered to in order to practice the invention. In other instances, specific processes, materials, and techniques that would be understood by a person of ordinary skill in the art are not set forth so as not to obscure the description of the invention.

Figure 1:
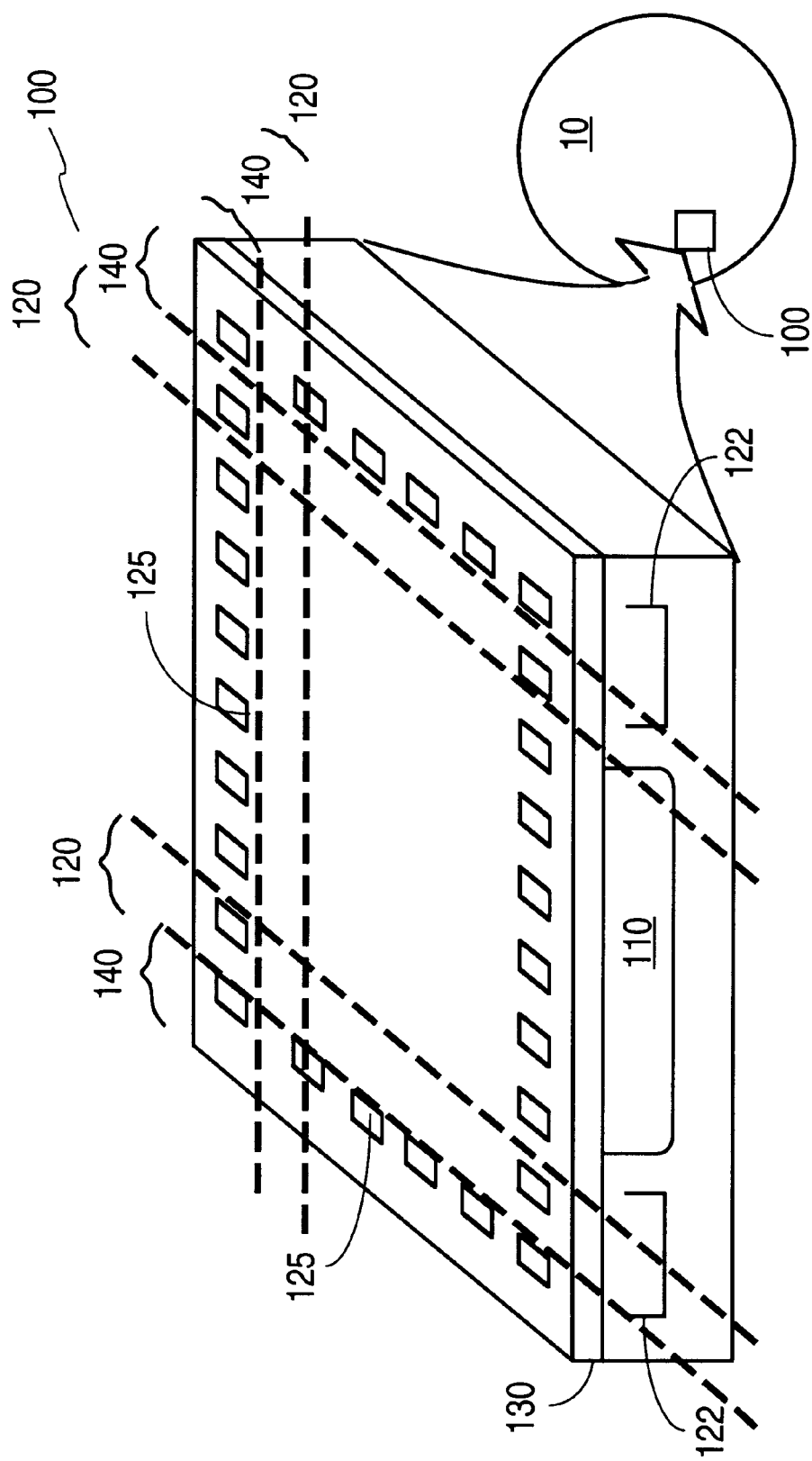
FIG. 1 is a schematic, perspective top view of a prior art image capturing device or chip having a top surface including a passivation layer and exposed bond pads.
Figure 2:
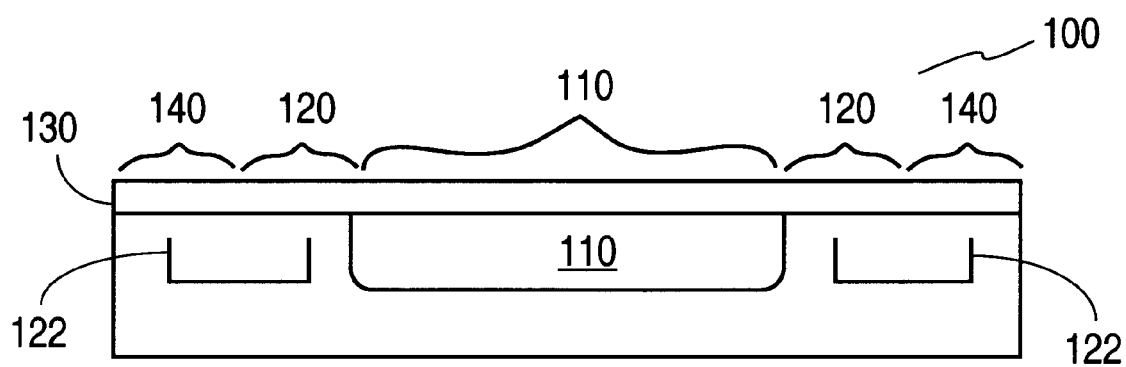
FIG. 2 is a planar side view of the device of FIG. 1.

FIG. 3 is a schematic, planar side view representation of an image capturing device or chip in accordance with an embodiment of the invention. In FIG. 3, image capturing device or chip 200 includes a sensor area 210 that contains individual pixels each having a photosensing structure. Image capturing device 200 also contains logic circuitry 222 displaced, in part, in a logic area portion 220 that surrounds sensor area 210. Peripherally surrounding logic area 220 is bond pad area 245. Collectively, logic area 220 and bond pad area 245 represent a non-sensor area. Image capturing device 200 is similar to image capturing device 100 shown in FIGS. 1 and 2.

The top surface of image capturing device 200 includes conductive layer 205. Overlying conductive layer 205 is passivation layer 230 that, in part, protects device 200 from environmental contaminants, particularly moisture. Suitable material for passivation layer 230 includes $Si_3N_4$ or $Si_xO_yN_z$. In one embodiment, passivation layer 230 is $Si_3N_4$ or $Si_xO_yN_z$ applied to a thickness of approximately 8000 Å across the entire surface of device 200 including logic area 220 and sensor area 210.

FIG. 4 shows the subsequent processing step of applying a first color filter material layer 240 over the entire surface of device 200. In FIG. 4, color filter material 240 is, for example, an acrylic polymer. In one embodiment, first color filter material 240 is one of a Red, Green, or Blue acrylic polymer. In this embodiment, first color filter material 240 is applied to a thickness of approximately 1 µm. It is to be appreciated that this thickness can vary according to the color requirements and light transmittance requirements of device 200.

Once first color filter material layer 240 is deposited, an etch 250 is used to pattern first color filter material 240. First color filter material 240 is patterned so that only those pixels that are to be covered with first color filter material 240 are protected. In FIG. 3, pixel 1 and pixel 4 are protected. A suitable etchant for etching a first color filter material that is an acrylic polymer is a wet etch using an organic solvent. FIG. 5 shows device 200 with first color filter material 240 patterned over pixel 1 and pixel 4.

FIG. 6 shows the further processing step of depositing a second color filter material 260 over image sensor device 200. Second color filter material 260 is deposited over the entire chip surface including over bond pad area 245, logic area 220, and sensor area 210. Second color filter material 260 is, for example, a Red, Green, or Blue acrylic polymer but, generally, is not the same color (i.e., Red, Green, or Blue) as first color filter material 240. In one embodiment, second color filter material 260 is deposited to a thickness of approximately 1 µm.

Once deposited, second color filter material 270 is etched by a suitable etchant as represented by reference numeral 270. The etch serves to pattern second color filter material 270 over the desired pixels in sensor area 210 (pixel 2) and also over a scratch protection area 248. Scratch protection area 248 represents a portion of the non-sensor area defined, in one embodiment, by a portion of logic area 220 and bond pad area 245. FIG. 7 shows image capturing device 200 having patterned first color filter material 230 overlying pixel 1 and pixel 4 and patterned second color filter material 260 pixel 2 and scratch protection area 248.

FIG. 8 shows the subsequent processing step of depositing a third color filter material layer 280 over image capturing device or chip 200. Third color filter material 280 is typically the remaining color, i.e., Red, Green, or Blue, that was not patterned in either first color filter material layer 240 or second color filter material layer 260. In one embodiment, third color filter material 280 is an acrylic polymer deposited to a 5 thickness of approximately 1.5 µm.

Next, third color filter material 280 is exposed to a suitable etchant 285 to pattern third color filter material 280 over the desired pixels of sensor area 210 (pixel 3) and scratch protection area 248. FIG. 9 shows first color filter material 240 patterned over pixel 1 and pixel 4, second color filter material 260 patterned over pixel 2 and scratch protection area 248, and third color filter material 280 patterned over pixel 3 and scratch protection area 248.

FIG. 9 shows second color filter material 260 and third color filter material 280 overlying scratch protection area 248. In this manner, the combination of second color filter material 260 and third color filter material 280 serve as a protection layer for passivation layer 230 in logic area 220. Acrylic polymer has hardness properties very similar to photodefineable polyimide material used in prior art processes. This has been experimentally confirmed by hardness and Youngs modulus measurements.

Experimental evidence demonstrates that a 2.5 μm protection layer of acrylic polymer color filter material is adequate to protect passivation layer 230 from subsequent handling steps and was found to be equivalent to the protection polyimide provides in prior art devices, such as microprocessors. It is to be appreciated that the invention is not limited to utilizing two color filter material layers or a color filter material thickness of 2.5 μm. Modifications, including, but not limited to, depositing one acrylic polymer color filter material to a thickness of 2.5 μm or greater, depositing three color filter material layers over scratch protection area 248, or depositing a different color filter material at a different thickness are also contemplated.

Figure 10:
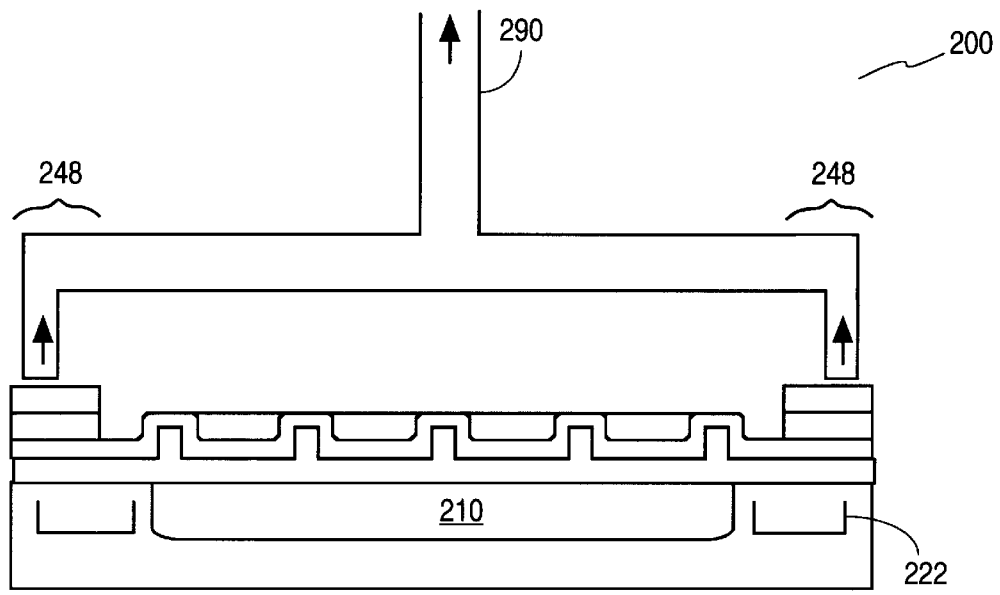
FIG. 10 is a planar side view of the device of FIG. 3 showing the further processing step of picking up the device or chip with a collet for transport to a package in accordance with an embodiment of the invention.

FIG. 10 shows the subsequent processing step of removing image capturing device 220 from the fabrication process and placing device or chip 200 in a suitable package. Initially, device 200 is separated from a wafer generally containing a plurality of devices by a sawing process. Then, a collet 290 under vacuum is brought into contact with device 200. In this embodiment, a specially designed collet 290 contacts device 200 over scratch protection area 248 and lifts device 200 from scratch protection area 248. In this manner, collet 290 does not contact sensor area 210. In one embodiment, scratch protection area 248 is approximately 600 μm wide about the periphery of the top surface area of device 200. In this embodiment, a collet having a collet arm width of approximately 300 μm is used to contact device 200 and transfer device or chip 200 to a package. The difference between the collet arm width and the width of scratch protection area 248 is generally due to the tolerance requirements of the pick and place process. It is to be appreciated that the scratch protection area be of a sufficient width to protect the passivation layer from possible damage by the collet. In this embodiment, collet 290 contacts only color filter material in scratch protection area 248 and does not contact passivation layer 230.

Figure 11:
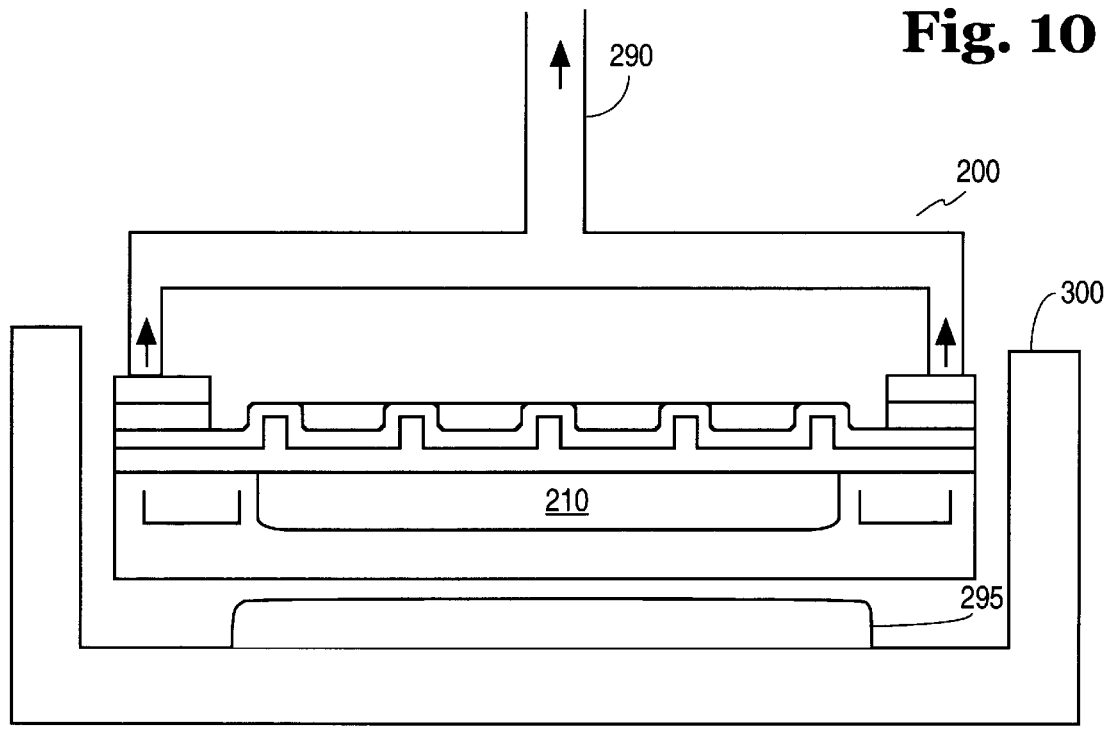
FIG. 11 is a planar side view of the device of FIG. 3 showing the further processing step of utilizing a collet to place the device in a package in accordance with an embodiment of the invention.
Figure 12:
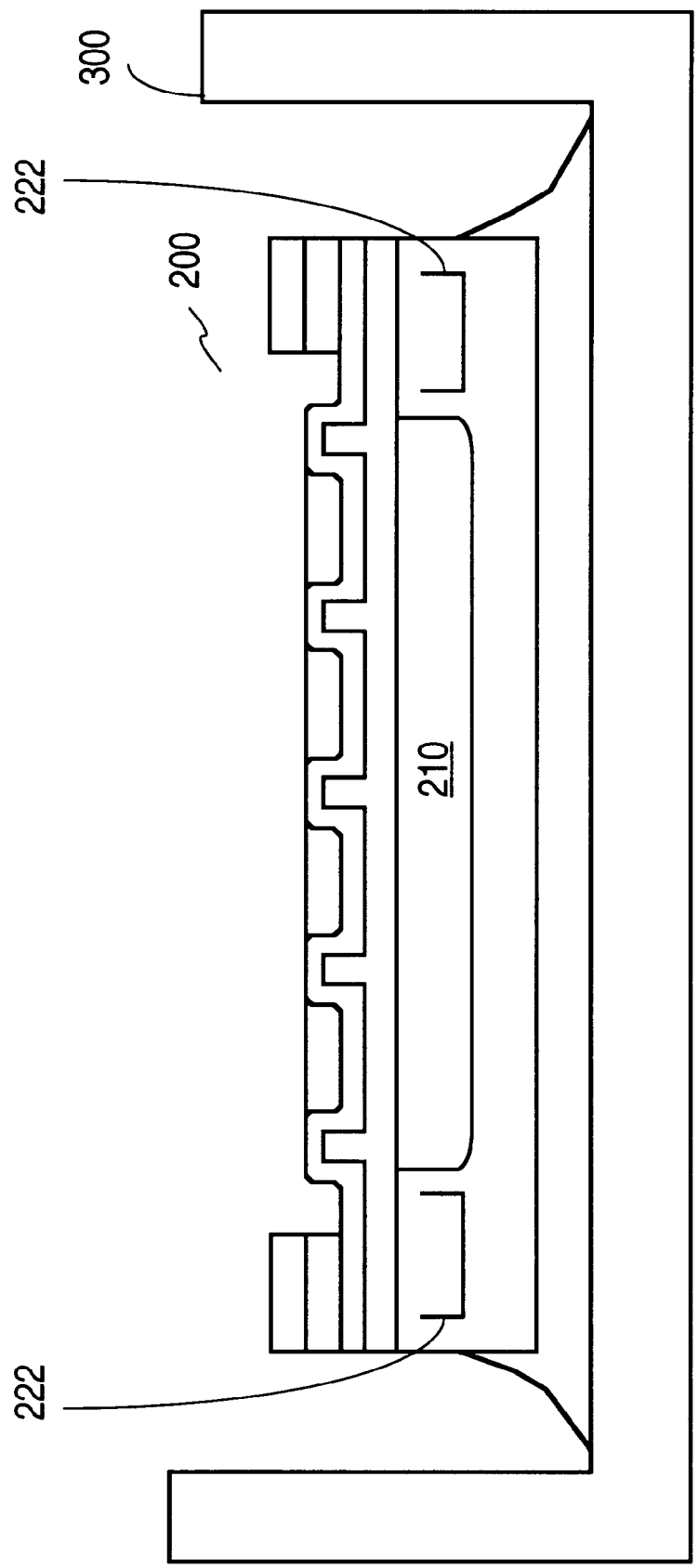
FIG. 12 is a planar side view of the device of FIG. 3 showing the device bound to a package in accordance with an embodiment of the invention.

FIG. 11 shows the subsequent processing step of transferring image capturing device or chip 200 into package 300 by collet 290. Collet 290 maintains the horizontal integrity of device 200 and lowers device 200 into package 300 above die-attach epoxy 295. Once device 200 contacts epoxy 295, collet scrubs epoxy 295 by moving device.200 back and forth in epoxy 295 to ensure complete contact of the bottom surface of device 200 with epoxy 295 and to maintain the horizontal displacement of device 200 in package 300 in conformance with die tilt requirements. Tight die tilt requirements may be adequately met by a peripheral contact collet as opposed to a non-contact collet (e.g., a funnel-shaped collet). Thus, the inclusion of a scratch protection layer 248 on device 200 allows the use of a peripheral-contact collet. FIG. 12 shows image capturing device or chip 200 seated in package 300.

By using color filter material as a protection layer for passivation layer 230, passivation layer 230 is not damaged during the handling process. The protection layer maintains the integrity of passivation layer 230 and, thus, the integrity and robustness of device or chip 200. The process described by the invention has little, if any, impact to cost, throughput time, and processing steps. Instead, the invention utilizes color filter material, that is otherwise patterned over specific pixels in sensor area 210 and that, in prior art processes, would be removed from scratch protection area 248 of a device, to pattern that material over scratch protection area 248 to serve as a protection layer for passivation layer 230.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A sensor device comprising:
    an integrated circuit having a sensor portion comprising a plurality of pixels and a non-sensor portion comprising a logic area portion and a bond pad area portion including a peripheral portion disposed solely about the periphery of said sensor portion;
    a passivation layer overlying a portion of a top surface of said peripheral portion of non-sensor portion of said integrated circuit; and
    a protection layer comprising a color filter material overlying said passivation layer in said peripheral portion of said non-sensor portion.

2. The sensor device of claim 1, wherein said protection layer is greater than 1 micron.

3. The sensor device of claim 1, said protection layer is a first protection layer, the device further comprising a second protection layer overlying said first protection layer.

4. The sensor device of claim 3, wherein said first protection layer is a first color filter material having a thickness of about 1 micron, and said second protection layer is a second color filter material having a thickness of about 1 micron.

5. A sensor device comprising:
    an integrated circuit including a top surface having a sensor portion and a non-sensor portion comprising a login area portion and a bond pad area portion including a peripheral portion disposed, in relation to the sensor portion, solely about the periphery of said sensor portion;
    a passivation layer overlying said peripheral portion of said non-sensor portion;
    a first color filter layer overlying said passivation layer in said peripheral portion of said non-sensor portion; and
    a second color filter layer overlying said first color filter layer.

6. The sensor device of claims 5, wherein said first color filter layer has a thickness of about one micron and said second color filter layer has a thickness of about one micron.

7. An imaging system comprising:
    a sensor device including an integrated circuit having a sensor portion comprising a plurality of pixels and a non-sensor portion comprising a logic area portion and a bond pad area portion including a peripheral portion disposed solely about the periphery of said sensor portion, a passivation layer overlying a portion of a top surface of said non-sensor portion of said integrated circuit, and a protection layer comprising a color filter material overlying said passivation layer in said peripheral portion of said non-sensor portion.

8. The imaging system of claim 7, wherein said protection layer of said sensor device is greater than 1 micron.

9. The imaging system of claim 7, said protection layer of said sensor device is a first protection layer, the sensor device further including a second protection layer overlying said first protection layer.

10. The imaging system of claim 9, wherein said first protection layer of said sensor device is a first color filter material having a thickness of about 1 micron, and said second protection layer is a second color filter material having a thickness of about 1 micron.

11. A method of forming a sensor device comprising:

passivating with a passivation layer a top surface of an integrated circuit device having a sensor portion comprising a plurality of pixels and a non-sensor portion comprising a logic area portion and a bond pad area portion including a peripheral portion disposed solely about the periphery of said peripheral portion of said sensor portion; and patterning a protection layer comprising a color filter material over said passivation layer.

12. The method of claim 11, wherein patterning a protection layer includes patterning the protection layer to a thickness of greater than one micron.

13. The method of claim 11, wherein patterning a protection layer includes patterning a first protection layer that is a first color filter material and patterning a second protection layer that is a second color filter material.

14. The method of claim 11, wherein patterning a protection layer includes patterning said first protection layer to a thickness of about one micron and patterning said second protection layer to a thickness of about one micron.

* * * * *